(12) United States Patent
Jiang et al.

(10) Patent No.: US 10,629,761 B2
(45) Date of Patent: Apr. 21, 2020

(54) INTERNAL PROTECTION CIRCUIT STRUCTURE OF PHOTOVOLTAIC MODULE

(71) Applicant: Tongwei Solar Energy(Hefei) Co., Ltd., Hefei (CN)

(72) Inventors: Chengyin Jiang, Hefei (CN); Jun Sun, Hefei (CN); Fushen Zhou, Hefei (CN); Taihong Xie, Hefei (CN); Yi Xie, Hefei (CN)

(73) Assignee: TONGWEI SOLAR ENERGY (HEFEI) CO., LTD., Hefei (CN)

( * ) Notice: Subject to any disclaimer, the term of this patent is extended or adjusted under 35 U.S.C. 154(b) by 223 days.

(21) Appl. No.: 15/576,725

(22) PCT Filed: Aug. 28, 2017

(86) PCT No.: PCT/CN2017/099227
§ 371 (c)(1),
(2) Date: Nov. 24, 2017

(87) PCT Pub. No.: WO2019/041080
PCT Pub. Date: Mar. 7, 2019

(65) Prior Publication Data
US 2019/0221695 A1    Jul. 18, 2019

(51) Int. Cl.
*H01L 31/0443* (2014.01)
*H02S 40/34* (2014.01)
*H01L 31/02* (2006.01)

(52) U.S. Cl.
CPC .... *H01L 31/0443* (2014.12); *H01L 31/02021* (2013.01); *H02S 40/34* (2014.12); *Y02E 10/50* (2013.01)

(58) Field of Classification Search
CPC .............................. H01L 31/0443; H02S 40/34
See application file for complete search history.

(56) References Cited

U.S. PATENT DOCUMENTS

| 2014/0305485 | A1 | 10/2014 | Kuramoto et al. | |
|---|---|---|---|---|
| 2016/0141435 | A1* | 5/2016 | Sridhara | H02J 3/383 136/244 |

FOREIGN PATENT DOCUMENTS

| CN | 202423319 | * | 9/2005 |
|---|---|---|---|
| CN | 101304054 A | | 11/2008 |
| CN | 202423319 U | | 9/2012 |
| CN | 106165116 A | | 11/2016 |

* cited by examiner

*Primary Examiner* — Jayne L Mershon
(74) *Attorney, Agent, or Firm* — Bayramoglu Law Offices LLC

(57) ABSTRACT

An internal protection circuit structure of a photovoltaic module, which includes a plurality of solar cells including a first column, a second column, a third column, a fourth column, a fifth column, and a sixth column sequentially. Positive and negative electrodes of each column of the solar cells are sequentially connected in series to form a substring of the solar cell. The upper ends of the second column and the third column are connected to each other with a first diode connected in series to be pulled out as an outgoing terminal. The present invention uses a manner in which substrings are connected first in series and later in parallel, with four bypass diodes connected in the circuit. As such, the actual utilization ratio of the solar cell is improved.

2 Claims, 1 Drawing Sheet

INTERNAL PROTECTION CIRCUIT STRUCTURE OF PHOTOVOLTAIC MODULE

CROSS REFERENCE TO RELATED APPLICATIONS

This application is the national phase entry of International Application No. PCT/CN2017/099227, filed on Aug. 28, 2017, the entire contents of which are incorporated herein by reference.

TECHNICAL FIELD

The present invention relates to the technical field of encapsulation of solar crystalline silicon sliced battery module, in particular to an internal protection circuit structure of a photovoltaic module.

BACKGROUND

With the accelerating energy consumption of conventional fossil fuels such as coal, oil, natural gas, etc., the eco-environment is continuously deteriorating. Especially, due to the greenhouse gas emissions, the global climate change is getting worse and worse. Therefore, the sustainable development of human society has been seriously threatened. Countries all around the world have formulated their own energy development strategies to cope with the limitations of conventional fossil fuel resources and the environmental problems caused by the development and utilization of the conventional fossil fuels. Solar energy has become one of the most important renewable energy sources due to its reliability, safety, universality, long service life, environmental friendliness and resource sufficiency; and is expected to become the dominant energy for the future global electricity supply.

Considering the fact that green solar energy has been promoted and used vigorously, the components of the photovoltaic modules are encapsulated based on the electrical principle of low current and low loss (i.e., the power loss of photovoltaic modules is directly proportional to the square of the working current) through the slicing process (i.e., performing one-half laser cutting on conventional 6-inch solar cells) to obtain two separate complete power generating units, so as to increase the output power and electricity generating efficiency. Currently, the first-class photovoltaic module manufacturers in China such as Trina Solar, Canadian Solar, Jinko Solar, and JA Solar have all launched half-cell photovoltaic modules. Among them, manufacturers like Canadian Solar etc. have already sold the half-cell components in large numbers in the market and have earned an objective sales profit. Based on the consideration of the characteristics of the assembly line of existing manufacturing process, most of the internal protection circuits of the conventional half-cell photovoltaic modules available in the market are designed such that two strings are connected in parallel, and then three strings are connected in series. Otherwise, the two strings are connected in parallel, and then five strings are connected in series, wherein a plurality of diodes are connected in bypass to form a bus circuit (taking the 60-cell mode for an example). The final product, i.e. the half-cell photovoltaic modules, can achieve almost the same output voltage and current as that of the conventional photovoltaic modules, without significant impact or extra cost on the system-side application. Moreover, compared to the conventional product, the output power gain of the final product increases by about 5 watts, and the efficiency thereof increases by about 0.3%.

Generally, the 60-cell mode is taken as an example for the design of internal protection circuit of the existing half-cell photovoltaic modules. If the vertical outgoing is taken for an example, two strings are connected in parallel, and then three strings are connected in series, wherein two diodes are connected in bypass. If the lateral outgoing is taken for an example, two strings are connected in parallel, and then five strings are connected in series, wherein four diodes are connected in bypass. Considering the factors such as the compatibility of the assembly line of the manufacturing process of the conventional photovoltaic modules, the performance and reliability of the final product, etc., the above two kinds of internal protection circuit designs have some defects and drawbacks.

Taking the vertical outgoing as an example (i.e. 20 half-cells are connected to each other to form a substring power generating unit), two bypass diodes are used to protect the solar cells. If one substring in three substrings is shadowed to be put in the reverse bias state, the diodes connected in parallel to the shadowed substring are turned on and start to work. However, in reality, only one substring (40 half-cells in total) works effectively to generate electricity. Two-third of the substrings of the solar cell (80 half-cells in total) are bypassed such that the power generation capacity thereof is lost. In this case, the actual utilization rate of electricity generation of the half-cells is about 33% in total. In view of the electrical power output of the product, the levelized cost of electricity (LOCE) of the system side application of photovoltaic modules will be seriously affected. Moreover, the risk of failure in the reliability test of the products will be greatly increased. Therefore, the performance of the products is not stable. The obvious disadvantages are as follows. In order to laminate, layout, and encapsulate such kind of electrical design of the half-cell photovoltaic modules with the conventional (monolithic) processing assembly line, the processing operation cycle of the laminating and laying-out needs to be slightly sped up. Further, the compatibility of the method to the existing photovoltaic modules process assembly line is also relatively poor.

Taking the lateral outgoing as an example (i.e. 12 half-cells are connected to each other to form a substring power generating unit), four bypass diodes are used to protect the solar cells. If one substring in five substrings is shadowed to be put in the reverse bias state, the diodes connected in parallel with the shadowed substring are turned on and start to work. At this time, actually, only three-fifth substrings (72 half-cells in total) work effectively to generate electricity. Two-fifth of the substrings of the solar cell (48 half-cells in total) are bypassed such that the power generation capacity thereof is lost, and the actual utilization rate of electricity generation of the half-cells is about 60%. In view of the electrical power output of the product, compared to the above vertical outgoing method, the power generation capacity of the lateral outgoing method increases by about 27%. The obvious disadvantages are as follows. Usually, in the conventional laminating and laying-out process of photovoltaic modules, the flow direction of the semi-finished component is that the long-side pulls in the working position, and the long-side pulls out after the operation is done. Such flow direction conflicts with the lateral flowing path and cannot be achieved in the conventional process assembly line. Further, since there are four pairs of outgoing lines (eight lines in total), the processing operation cycle is seriously affected, raising the risk of defective products.

SUMMARY OF THE INVENTION

An object of the present invention is to provide an internal protection circuit structure of a photovoltaic module to solve the problems raised in the background.

To achieve the above object, the present invention provides the following technical solutions:

An internal protection circuit structure of a photovoltaic module, including a plurality of solar cells. The plurality of solar cells are equally divided into six columns including a first column, a second column, a third column, a fourth column, a fifth column, and a sixth column sequentially. Positive and negative electrodes of each column of the solar cells are connected in series sequentially to form a substring of the solar cell.

Polarities of upper ends of substring of solar cells are positive, negative, positive, positive, negative, and positive sequentially from the first column to the sixth column. Polarities of lower ends of the substring of solar cells are negative, positive, negative, negative, positive, and negative sequentially from the first column to the sixth column.

The upper ends of the first column and the sixth column are connected to each other to be pulled out as an outgoing terminal. Upper ends of the second column and the fifth column are connected to each other with a first diode connected in series to be pulled out as an outgoing terminal. Upper ends of the fourth column and the fifth column are connected to each other with a second diode connected in series to be pulled out as an outgoing terminal.

Lower ends of the first column and the second column are connected to each other with a third diode connected in series to be pulled out as an outgoing terminal. Lower ends of the third column and the fourth column are connected to each other to be pulled out as an outgoing terminal. Lower ends of the fifth column and the sixth column are connected to each other with a fourth diode connected in series to be pulled out as an outgoing terminal.

Preferably, the following outgoing terminals are all connected to a wiring terminal of a positive junction box, i.e., an outgoing terminal pulled out from the upper ends of the first column and the sixth column connected to each other, an outgoing terminal pulled out from the upper ends of the second column and the third column connected to each other with the first diode connected in series, an outgoing terminal pulled out from the upper ends of the fourth column and the fifth column connected to each other with the second diode connected in series.

Preferably, the following outgoing terminals are all connected to a wiring terminal of a negative junction box, i.e., an outgoing terminal pulled out from the lower ends of the first column and the second column connected to each other with the third diode connected in series, an outgoing terminal pulled out from the lower ends of the third column and the fourth column connected to each other, an outgoing terminal pulled out from the upper ends of the fifth column and the sixth column connected to each other with the fourth diode connected in series.

Preferably, the first diode and the second diode are provided in the positive junction box. The third diode and the fourth diode are provided in the negative junction box.

Compared with the prior art, the advantages of the present invention are as below:

The unique design of the internal encapsulation protection circuit of the present invention performs a protection function for the encapsulation of sliced photovoltaic module. By doing so, the low practical utilization rate of the total electricity generation of the half-cell can be effectively increased. Moreover, the operability of the process is improved. Furthermore, the design of the protection circuit is practical for mass production without additional investment costs. In the key part of the circuit design, the polarities of the upper ends of the photovoltaic module are "positive, negative, positive, positive, negative, positive", and the polarities of the lower ends of the photovoltaic module are "negative, positive, negative, negative, positive, negative". Three columns of half-cell substrings are connected to each other in series firstly. Next, two middle-sized strings are connected in parallel to collect the current conjointly. Meanwhile, three bypass diodes are provided in the circuit. The number of cells with an individual diode bypass is significantly reduced, such that a separate loop is formed. Thus, the actual power generation of the sliced photovoltaic module is prevented from being reduced.

The inventive concept of the present invention is a unique design of internal protection circuit, in which the four diodes are connected in bypass to effectively protect the half-cell. That is, the circuit design of the internal encapsulation is that the sliced cells are connected to each other, and then the four diodes are connected in bypass and in parallel. The present invention is different from the conventional design in which the cells are connected in parallel first and then in series, and the number of cells with diode bypass are large. Moreover, the present invention does not affect the operation. When the cell string is put in a reverse bias state due to the shadow on the module or other reasons, the practical utilization rate of the half-cell is improved. Moreover, the power generation performance and the reliability of the semi-cell module product are ensured. Finally, the output power and the power generation efficiency of the semi-chip module can be effectively improved. The levelized generation cost on the system side is reduced. Moreover, the half-cell module using the vertical outgoing method is compatible with the operational flow of the conventional photovoltaic module manufacturing process. Therefore, the manufacturing requirements of the half-cell modules can be met without extra fund investment to modify or upgrade the assembly line. Thus, the present invention is worth spreading vastly.

Figure 1:
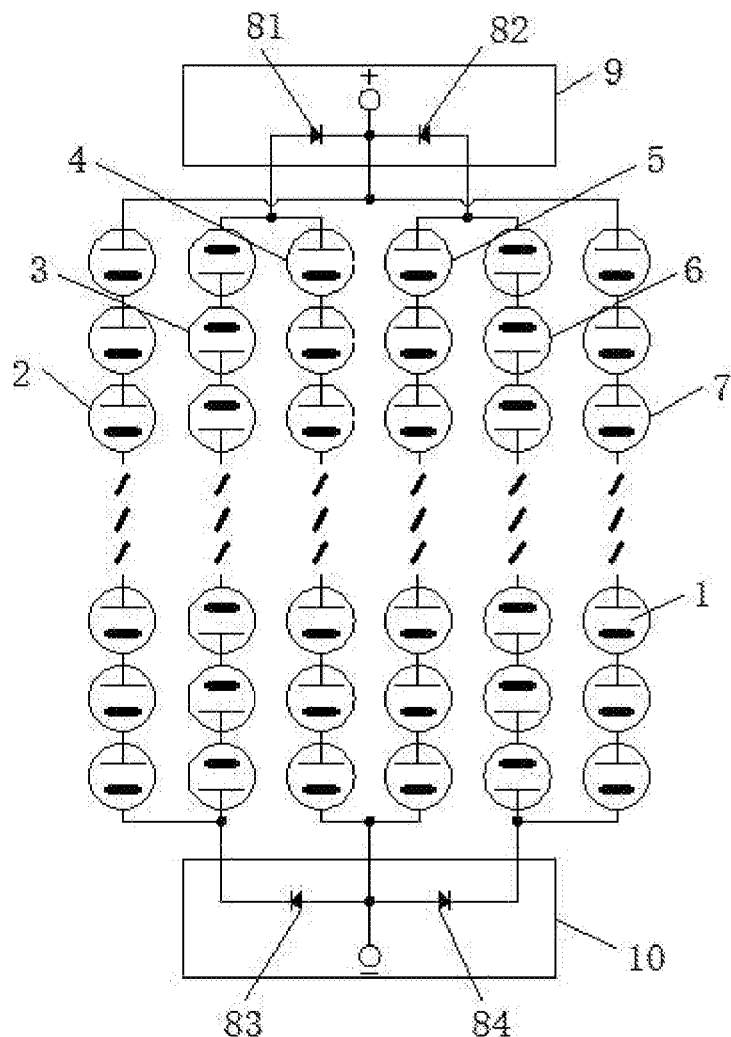
FIG. 1 is a schematic diagram of the circuit structure of the present invention.

In the drawings: 1, solar cell; 2, first column; 3, second column; 4, third column; 5, fourth column; 6, fifth column; 7, sixth column; 81, first diode; 82, second diode; 83, third diode; 84, fourth diode; 9, positive junction box; 10, negative junction box.

DETAILED DESCRIPTION OF THE INVENTION

The technical solutions in the embodiments of the present invention will be described clearly and completely hereinafter with reference to the accompanying drawings in the embodiments of the present invention. Apparently, the described embodiments are merely some but not all embodiments of the present invention. All other embodiments obtained by an ordinary person skilled in the art based on the embodiments of the present invention without creative efforts shall fall within the protective scope of the present invention.

Figure 2:
FIG. 2 is a schematic diagram of the structure of the positive and negative electrodes of the half-cell of the embodiment.

Referring to FIGS. 1-2, the present invention provides a technical solution as below:

An internal protection circuit structure of a photovoltaic module includes a plurality of solar cells 1. As shown in FIG. 2 of the specification, a long-line end of solar cell 1 is a positive electrode and a short-line end is a negative electrode. The plurality of solar cells 1 are equally divided into six columns, i.e., first column 2, second column 3, third column 4, fourth column 5, fifth column 6, and sixth column 7 sequentially. Positive and negative electrodes of each column of solar cells 1 are sequentially connected in series to form a substring of the solar cell. As shown in FIG. 1 of the specification, the omitted portion in the middle is a plurality of solar cells 1 combined in series or parallel.

The polarities of the upper ends of substrings of solar cells are positive, negative, positive, positive, negative, and positive in sequence from first column 2 to sixth column 7. The polarities of the lower ends of the substrings of solar cells are negative, positive, negative, negative, positive, and negative sequentially from first column 2 to sixth column 7.

The upper ends of first column 2 and sixth column 7 are connected to each other to be pulled out as an outgoing terminal. The upper ends of second column 3 and fifth column 4 are connected to each other with first diode 81 connected in series to be pulled out as an outgoing terminal. The upper ends of fourth column 5 and fifth column 6 are connected to each other with second diode 82 connected in series to be pulled out as an outgoing terminal. Three outgoing terminals of the upper ends are used to collect and output current respectively.

The lower ends of first column 2 and second column 3 are connected to each other with third diode 83 connected in series to be pulled out as an outgoing terminal. The lower ends of third column 4 and fourth column 5 are connected to each other to be pulled out as an outgoing terminal. The lower ends of fifth column 6 and sixth column 7 are connected to each other with fourth diode 84 connected in series to be pulled out as an outgoing terminal. Three outgoing terminals of the lower ends are used to collect and output current respectively.

As a preferred embodiment, the following outgoing terminals are all connected to a wiring terminal of positive junction box 9, i.e., an outgoing terminal pulled out from the upper ends of first column 2 and sixth column 7 that are connected to each other, an outgoing terminal pulled out from the upper ends of second column 3 and third column 4 that are connected to each other with first diode 81 connected in series, and an outgoing terminal pulled out from the upper ends of fourth column 5 and fifth column 6 that are connected to each other with second diode 82 connected in series. Thus, each current collection unit can transfer the current to the wiring terminal of positive junction box 9 to uniformly output the current, which is more convenient for external wiring.

As another preferred embodiment, the following outgoing terminals are all connected to a wiring terminal of negative junction box 10, i.e., an outgoing terminal pulled out from the lower ends of first column 2 and second column 3 that are connected to each other with third diode 83 connected in series, an outgoing terminal pulled out from the lower ends of third column 4 and fourth column 5 that are connected to each other, an outgoing terminal pulled out from the upper ends of fifth column 6 and sixth column 7 that are connected to each other with fourth diode 84 connected in series. Thus, each current collection unit can transfer the current to the wiring terminal of negative junction box 10 to uniformly output the current, which is more convenient for external wiring.

As another preferred embodiment, first diode 81 and second diode 82 are provided in positive junction box 9. Third diode 83 and fourth diode 84 are provided in negative junction box 10. Thus, it is convenient to install the diodes. Also, the diodes can be protected through the junction boxes.

The operation steps of the specific design of the internal protection circuit structure of a sliced photovoltaic module are as below:

Taking the 60-cell mode as an example, an intact 6-inch cell is divided into two small complete and separate power generating units after a laser cutting. A plurality of small power generating units are connected to each other by automatic series welding on an automatic series welding machine based on the number of solar cells connected to each other in one substring. Semi-finished interconnected solar cell substrings are stacked to connect to each other and collect currents based on the internal circuit structure designed in the present invention. Moreover, two separate junction boxes are provided. A single separate junction box contains two bypass diode.

1. An intact 6-inch solar cell wafer, which is face-up and back-down generally, is taken out from a special carrying case by the carrying robot arm, and is accurately placed in an area designated by a laser scribing machine.

2. The laser scribing machine performs laser cutting on the solar cell based on a certain energy ratio setting. The solar cell is cut into a half size. After the cutting is completed, the next step following the laser scribing machine has an automatic wafer-slitting function. Moreover, the cut wafers having full function and separate structure are automatically collected into the material carrying case used by the series welding machine.

3. The cut solar cells are fed in based on the welding requirements of the half-cell automatic series welding machine. Next, an appearance visual inspection is performed. Then, soldering flux is sprayed on the silver paste of the main grid of the solar cell. Meanwhile, the photovoltaic welding strip is flattened, stretched, cut, and laid on the half-cell.

4. The parameters of welding temperature, welding time, the number of interconnected solar cells, the length of reserved photovoltaic solder strip at both ends of the substring, etc. are set based on the parameters of the welding process to complete the automatic welding. After an automatic appearance inspection and an EL inspection of the string, the qualified half-sized cell strings are passed to the automatic typesetting machine in the next step.

5. The automatic typesetting machine conducts typesetting of polarities of substrings of solar cells automatically based on the following rules. That is, the polarities of the upper ends of the substrings of solar cells are positive (+), negative (−), positive (+), positive (+), negative (−), positive (+), while the polarities of the lower ends of the substrings of solar cells are negative (−), positive (+), negative (−), negative (−), positive (+), negative (−). Moreover, the interval between the substrings of the solar cells satisfies the requirements of the manufacturing process drawings of the half-cell photovoltaic module.

6. The worker who performs the lamination conducts the laying out and welding in a way that three substrings of solar cells are connected to each other in series, and two big substrings are connected in parallel to collect the current conjointly. The design of the circuit is that three substrings of solar cells are connected to each other in series and two big substrings of solar cells connected in parallel. Vertical outgoing lines are mainly used. After the lamination is completed, three outgoing lines are provided both above and below the short-side direction, so as to facilitate the connection of the junction box.

7. After the stacked half-finished half-cell module is laminated and trimmed, two separate junction boxes are respectively arranged above and below the short side of the module. Each separate junction box is provided with two bypass diodes. Next, curing, cleaning, testing, and product packaging, etc. are performed. In the testing step, an opposite side wiring terminal should be newly added based on the conventional module test.

8. In the system terminal, the half-cell component uses a lateral mounting method. Compared to the conventional vertical mounting method, the actual electricity generating capacity is increased, and the cable consumption is reduced by 5% accordingly. Thus, the initial investment costs of the photovoltaic plant can be effectively reduced.

Although the embodiments of the present invention have been shown and described, it will be apparent to an ordinary person skilled in the art that various changes, modifications, substitutions, and alterations can be made to these embodiments without departing from the spirit and scope of the present invention. The scope of the present invention is equivalently defined by the appended claims.

What is claimed is:

1. An internal protection circuit structure of a photovoltaic module, consisting of:
   a plurality of solar cells,
   wherein
   the plurality of solar cells are equally divided into six columns including a first column, a second column, a third column, a fourth column, a fifth column, and a sixth column sequentially;
   positive and negative electrodes of each column of the plurality of solar cells are connected in series sequentially to form a substring of the plurality of solar cell;
   polarities of upper ends of substrings of solar cells are positive, negative, positive, positive, negative, and positive sequentially from the first column to the sixth column;
   polarities of lower ends of the substrings of solar cells are negative, positive, negative, negative, positive, and negative sequentially from the first column to the sixth column;
   upper ends of the first column and the sixth column are connected to each other to be pulled out as a first outgoing terminal;
   upper ends of the second column and the third column are connected to each other and with a first diode connected in series to be pulled out as a second outgoing terminal;
   upper ends of the fourth column and the fifth column are connected to each other and with a second diode connected in series to be pulled out as a third outgoing terminal;
   lower ends of the first column and the second column are connected to each other and with a third diode connected in series to be pulled out as a fourth outgoing terminal;
   lower ends of the third column and the fourth column are connected to each other to be pulled out as a fifth outgoing terminal; and
   lower ends of the fifth column and the sixth column are connected to each other and with a fourth diode connected in series to be pulled out as a sixth outgoing terminal;
   wherein the first outgoing terminal, the second outgoing terminal and the third outgoing terminal are all connected to a wiring terminal of a positive junction box;
   wherein the fourth outgoing terminal, the fifth outgoing terminal and the sixth outgoing terminal are all connected to a wiring terminal of a negative junction box.

2. The internal protection circuit structure of a photovoltaic module according to claim 1,
   wherein the first diode and the second diode are provided in the positive junction box; and
   the third diode and the fourth diode are provided in the negative junction box.

* * * * *